United States Patent [19]

Frass et al.

[11] Patent Number: 5,085,974

[45] Date of Patent: * Feb. 4, 1992

[54] PHOTOPOLYMERIZABLE MIXTURE, AND A RECORDING MATERIAL PRODUCED THEREFROM

[75] Inventors: Werner Frass, Wiesbaden; Dieter Mohr, Budenheim; Klaus Rode, Wiesbaden, all of Fed. Rep. of Germany

[73] Assignee: Hoechst Aktiengesellschaft, Frankfurt am Main, Fed. Rep. of Germany

[*] Notice: The portion of the term of this patent subsequent to Jan. 8, 2008 has been disclaimed.

[21] Appl. No.: 174,426

[22] Filed: Mar. 28, 1988

[30] Foreign Application Priority Data

Mar. 28, 1987 [DE] Fed. Rep. of Germany ....... 3710282

[51] Int. Cl.$^5$ ............................................. G03F 7/031
[52] U.S. Cl. .................................... 430/284; 430/915;
430/287; 430/288; 522/25; 522/26
[58] Field of Search .......................... 522/26, 25, 95;
430/915, 284, 283, 286, 287; 525/278

[56] References Cited

U.S. PATENT DOCUMENTS

| | | | |
|---|---|---|---|
| 2,850,445 | 9/1958 | Oster | 522/63 |
| 2,875,047 | 2/1959 | Oster | 522/79 |
| 3,097,096 | 7/1963 | Oster | 522/84 |
| 3,488,269 | 1/1970 | Allen et al. | 204/159.23 |
| 3,597,343 | 8/1971 | Delzenne et al. | 204/159.23 |
| 3,759,807 | 9/1973 | Osborn et al. | 204/159.23 |
| 3,782,961 | 1/1974 | Takahashi | 96/115 R |
| 3,850,770 | 11/1974 | Juna et al. | 204/159.19 |
| 3,864,133 | 2/1975 | Hisamatsu et al. | 430/284 |
| 3,960,572 | 6/1976 | Ibata et al. | 96/115 P |
| 4,019,972 | 4/1977 | Faust | 204/159.15 |
| 4,054,682 | 10/1977 | Kuesters et al. | 427/54 |
| 4,071,424 | 1/1978 | Dart et al. | 204/159.15 |
| 4,250,248 | 2/1981 | Faust | 430/284 |
| 4,266,004 | 5/1981 | Kern | 430/287 |
| 4,279,982 | 7/1981 | Iwasaki et al. | 430/170 |
| 4,293,635 | 10/1981 | Flint et al. | 430/281 |
| 4,339,566 | 7/1982 | Rosenkranz | 528/68 |
| 4,458,007 | 7/1984 | Geissler et al. | 430/284 |
| 4,495,271 | 1/1985 | Geissler et al. | 430/277 |
| 4,517,281 | 5/1985 | Briney et al. | 430/322 |
| 4,559,382 | 12/1985 | Martens et al. | 524/535 |
| 4,636,459 | 1/1987 | Kawamura | 430/288 |
| 4,650,743 | 3/1987 | Galloway | 430/278 |
| 4,732,840 | 8/1988 | Hasegawa | 430/302 |
| 4,895,788 | 1/1990 | Walls et al. | 430/285 |
| 4,956,264 | 9/1990 | Geissler et al. | 430/283 |
| 4,983,498 | 1/1991 | Rode et al. | 430/284 |

OTHER PUBLICATIONS

Chemical Abstracts, 74-Radiation Chem., Photochem., vol. 85, 1976, 85:54620a, Photoresists For Printing Platemaking and Printed Circuit Fabrication, p. 555.

*Photoresist*, W. S. DeForest, McGraw-Hill Book Co., New York, pp. 178-183, 1975.

*Photopolymerization of Surface Coatings*, C. G. Roffey, John Wiley and Son, Chichester, pp. 182-185, 1982.

*Primary Examiner*—Marion E. McCamish
*Assistant Examiner*—Christopher D. RoDee
*Attorney, Agent, or Firm*—Foley & Lardner

[57] ABSTRACT

A photopolymerizable mixture is disclosed which comprises
a) a polymeric binder,
b) an acrylate or alkacrylate of a polyhydric alcohol containing one or more groups which are photooxidizable on exposure in the presence of the photoreducible dye, and one or more urethane groups,
c) a photoreducible dye as photoinitiator.

The mixture is suitable for the production of printing plates and photoresists and is distinguished by increased photosensitivity, which can be even further increased by the addition of a photolytically cleavable compound which contains at least one trihalomethyl group. A recording material comprising the photopolymerizable mixture is also disclosed.

19 Claims, No Drawings

PHOTOPOLYMERIZABLE MIXTURE, AND A RECORDING MATERIAL PRODUCED THEREFROM

BACKGROUND OF THE INVENTION

The invention relates to a photopolymerizable mixture which contains a polymeric binder, a polymerizable compound having at least two acrylate or alkacrylate groups in the molecule, and a photoinitiator.

Photopolymerizable mixtures which contain acrylates and/or methacrylates as polymerizable compounds are known. For the production of photoresist materials, in particular dry photoresist coatings, mixtures are preferred which contain acrylates or methacrylates having urethane groups in the molecule and which can be developed using aqueous-alkaline solutions. Such mixtures are described, for example, in German Offenlegungsschrift No. 2,822,190, German Auslegeschrift No. 2,115,373, German Patent No. 2,361,041 and U.S. Pat. Nos. 3,850,770 and No. 3,960,572.

On the other hand, photopolymerizable mixtures are also known which, in order to increase the photosensitivity, contain certain combinations of photoinitiators and activators, for example carbonyl group-containing initiators and tertiary amines. Such mixtures with a synergistic action are described, for example, in German Offenlegungsschriften No. 2,602,419 and No. 2,251,048 and U.S. Pat. No. 3,759,807. A disadvantage of these mixtures which contain low molecular-weight amines is that they have a short shelf life since the amines can easily bleed out, in particular from thin coatings.

In Japanese Patent Application No. 50/129,214, a photopolymerizable mixture is described which contains a tetra(meth)acrylate of a N,N,N',N'-tetrahydroxyalkylalkylenediamine as a polymerizable compound. The tetrafunctional compound serves as crosslinking agent.

It is additionally known that the free-radical polymerization of ethylenically unsaturated compounds can be initiated by irradiation with visible light in the presence of photoreducible dyes and reducing agents, for example amines (U.S. Pat. No. 3,097,096). However, these initiator combinations are essentially employed only in aqueous solution or in combination with water-soluble binders.

Initiator combinations of photoreducible dyes and other reducing agents are described in U.S. Pat. Nos. 3,597,343 and 3,488,269. Photopolymerizable mixtures which contain exclusively photoreducible dyes as initiators have hitherto not been employed in practice due to their inadequate photosensitivity.

SUMMARY OF THE INVENTION

It is therefore an object of the present invention to provide photopolymerizable mixtures which are suitable for the production of printing plates for long runs.

It is a further object of the present invention to provide photoresists that have high resistance in the hardened state to processing solutions and high photosensitivity in the near ultra-violet and visible spectral regions.

In accomplishing these and other objects, there is provided a photopolymerizable mixture comprising a polymeric binder, an acrylate or alkacrylate of a polyhydric alcohol and a photoreducible dye as an initiator. The acrylate or alkacrylate has one or more groups which are photooxidizable upon exposure in the presence of the photoreducible dye, and one or more urethane groups. A photopolymerizable recording material comprising a layer support and the photopolymerizable mixture is also provided.

DETAILED DESCRIPTION OF THE PREFERRED EMBODIMENTS

According to the invention, there is provided a photopolymerizable mixture which contains, as essential components, a) a polymeric binder,
b) an acrylate or alkacrylate of a polyhydric alcohol, and
c) a photoreducible dye as photoinitiator.

According to the present invention the acrylate or alkacrylate contains one or more groups which are photooxidizable on exposure in the presence of the photoreducible dye, and one or more urethane groups.

Suitable photooxidizable groups are, in particular, amino groups, thio groups, which can also be components of heterocyclic rings, enol groups and carboxyl groups in combination with olefinic double bonds. Examples of such groups are triethanolamino, triphenylamino, thiourea, imidazole, oxazole, thiazole, acetylacetonyl, N-phenyl-glycine and ascorbic acid groups. Polymerizable compounds containing primary, secondary and, in particular, tertiary amino groups are preferred.

It is particularly advantageous to employ acrylates and alkacrylates of the formula I

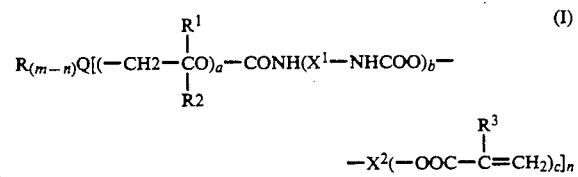

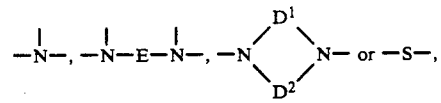

in which
Q denotes $$-N-,\ -N-E-N-,\ -N\begin{matrix}D^1\\ \\D^2\end{matrix}N-\ \text{or}\ -S-,$$

R denotes an alkyl, hydroxyalkyl or aryl group,
$R^1$ and $R^2$ each denote a hydrogen atom, an alkyl group or an alkoxyalkyl group,
$R^3$ denotes a hydrogen atom, a methyl group or an ethyl group,
$X^1$ denotes a saturated hydrocarbon group having 2 to 12 carbon atoms,
$X^2$ denotes a (c+1)-valent saturated hydrocarbon group in which up to 5 methylene groups may be replaced by oxygen atoms,
$D^1$ and $D^2$ each denote a saturated hydrocarbon group having 1 to 5 carbon atoms,
E denotes a saturated hydrocarbon group having 2 to 12 carbon atoms, a cycloaliphatic group which has 5 to 7 ring members and which contains up to 2 N, O or S atoms as ring members, an arylene group having 6 to 12 carbon atoms, or a heterocyclic aromatic group having 5 or 6 ring members,
a denotes 0 or an integer from 1 to 4, b denotes 0 or 1,
c denotes an integer from 1 to 3,
m denotes 2, 3 or 4, depending on the valence of Q, and
n denotes an integer from 1 to m, it being possible for all radicals of the same definition to be identical to or different from one another.

The compounds of this formula and their preparation are described in detail in copending application Ser. No. 173,936 (corresponding to German Patent Application P 3,710,279.6 filed simultaneously herewith, the contents of which are hereby incorporated by reference.

Where, in the compound of the general formula I, more than one R radical or more than one radical of the type mentioned in brackets is bound to the central group Q, these radicals may be different from one another.

Compounds in which all substituents of Q are polymerizable radicals, i.e. in which m=n, are generally preferred.

In general, a=0 is not more than one radical, and preferably a=1.

If R is an alkyl or hydroxyalkyl group, it generally has from 2 to 8, preferably from 2 to 4, carbon atoms. The aryl group R can generally be mononuclear or dinuclear, preferably mononuclear, and can optionally be substituted by alkyl or alkoxy groups having up to 5 carbon atoms or by halogen atoms.

If $R^1$ and $R^2$ are alkyl or alkoxyalkyl groups, they can contain from 1 to 5 carbon atoms.

$R^3$ is preferably a hydrogen atom or a methyl group, in particular a methyl group.

$X^1$ is preferably a straight-chain or branched aliphatic or cycloaliphatic radical, preferably having from 4 to 10 carbon atoms.

$X^2$ preferably has 2 to 15 carbon atoms, of which up to 5 may be replaced by oxygen atoms. If these are pure carbon chains, those having from 2 to 12, preferably from 2 to 6, carbon atoms are generally employed. $X^2$ can also be a cycloaliphatic group having 5 to 10 carbon atoms, in particular a cyclohexyl group.

$D^1$ and $D^2$ may be identical or different and, together with the two nitrogen atoms, form a saturated heterocyclic ring having from 5 to 10, and preferably 6, ring members.

If E is an alkylene group, it preferably has from 2 to 6 carbon atoms, and as an arylene group it is preferably a phenylene group. As cycloaliphatic groups, cyclohexylene groups are preferred, and as aromatic heterocyclic rings, those containing N or S as heteroatoms and having 5 to 6 ring members are preferred.

The value of c is preferably 1.

The polymerizable compounds of the formula I where Q=N and n=m and which contain two urethane groups in each radical (b=1) are prepared by reacting acrylates or alkylacrylates which contain free hydroxyl groups in a known fashion with the same number of moles of diisocyanates, and reacting the excess isocyanate group with hydroxyalkylamines. When a=0, a urea group is produced.

Examples of the hydroxyalkylamines used as starting materials are triethanolamine, N-alkyl-N,N-di(hydroxyalkyl)-amines, diethanolamine, tris-(2-hydroxypropyl)amine or tris-(2-hydroxybutyl) amine.

The diisocyanates used as starting materials include, for example, ethylene diisocyanate, propylene diisocyanate, butylene-1,3-diisocyanate, hexamethylene diisocyanate, 2,2,4-trimethylhexamethylene diisocyanate, 2,4-dimethyl-6-ethyloctamethylene diisocyanate, 1,4-cyclohexylene diisocyanate, 1,3-cyclopentylene diisocyanate, 1,4-diisocyanato-methylcyclohexane and 1,1,3-trimethyl-3-isocyanatomethyl-5-isocyanatocyclohexane.

The hydroxyl-group-containing esters used are, in particular, hydroxyethyl methacrylate and hydroxypropyl methacrylate ("n" or "iso"), and furthermore the corresponding acrylates, because they are the simplest representatives of this group. However, the following compounds can also be used with advantage: 2-hydroxybutyl methacrylate, 4-hydroxybutyl methacrylate, 2-hydroxycyclohexyl methacrylate and other hydroxyalkyl methacrylates having up to 12, preferably up to 6, carbon atoms in the alkyl radical, diethylene glycol monomethacrylate, triethylene glycol monomethacrylate and other polyethylene glycol monomethacrylates having up to 5 oxyethylene units, trimethylolethane dimethacrylate, trimethylolpropane dimethacrylate, pentaerythritol trimethacrylate, and corresponding acrylates.

The polymerizable compounds of the formula I, where n=3 and b=0, are prepared by reacting the above-described hydroxyalkylamines with isocyanate group containing acrylates or alkylacrylates.

The isocyanate-group-containing ester employed is, in particular, isocyanatoethyl (meth)acrylate. However, the following compounds can also be used with advantage: 3-isocyanatopropyl methacrylate, 4-isocyanatobutyl methacrylate, isocyanatoisohexyl methacrylate and other isocyanatoalkyl (meth)acrylates having up to 12, preferably up to 6, carbon atoms in the alkyl radical.

The polymerizable compounds of the formula I where

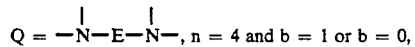

are prepared analogously to the polymerizable compounds where Q=N.

The polymerizable compounds of the formula I where

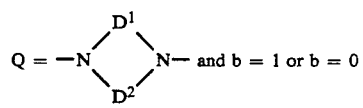

are also prepared analogously to the above-described polymerizable compounds.

The reaction of isocyanates with the OH-group-containing amines and alkylacrylates is expediently carried out in an inert solvent such as toluene, pyridine or methyl ethyl ketone. In order to thermally stabilize the products, which have a great tendency towards polymerization, quinones, preferably benzoquinone, are added in concentrations of 0.01–2% by weight.

The compounds of this invention where Q=S are prepared analogously to the general procedures given above, starting from the appropriate bis-hydroxyalkyl sulfide.

Besides other components, the above-described polymerizable compounds are responsible for the very high photosensitivity of the photopolymerizable mixtures.

In addition to the photooxidizable polymerizable compounds described, conventional polymerizable compounds which contain two or more polymerizable acrylate or methacrylate groups can also be added.

Examples are acrylates and methacrylates of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols. The products of the reaction of diisocyanates with partial esters of polyhydric alcohols can also be employed with advantage. Such monomers are described in German Offenlegungsschriften No. 2,064,079, No. 2,361,041 and No. 2,822,190.

The proportion of monomers in the mixture is generally about 10 to 80, preferably about 20 to 60% by weight.

The mixture according to the invention contains a photoreducible dye as photoinitiator component. Suitable dyes are, in particular, xanthene, thiazine, pyronine, porphyrine or acridine dyes. Preferred representatives of xanthene dyes are compounds of the general formula II

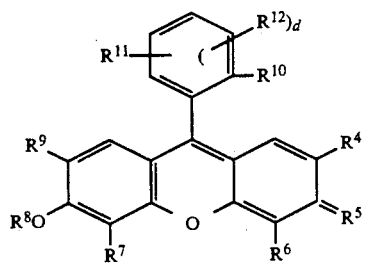
(II)

in which
$R^4$ and $R^9$ are identical or different and denote hydrogen or halogen atoms, nitro or hydroxyl groups or groups of the formula —HgOH,
$R^6$ and $R^7$ are identical or different and denote hydrogen or halogen atoms or hydroxyl groups,
$R^5$ denotes O or $^{(+)}$NHAlkyl $X^{(-)}$,
$R^8$ denotes a hydrogen atom, an alkali metal, ammonium or trialkylammonium cation, or an alkyl or acyl group,
$R^{10}$ denotes a hydrogen atom or a COOR$^{13}$ group,
$R^{11}$ denotes a hydrogen or halogen atom or an amino group,
$R^{12}$ denotes a hydrogen or halogen atom,
$R^{13}$ denotes a hydrogen atom, an alkali metal or ammonium cation, an alkyl group or a polymeric radical,
X denotes an anion, and
d denotes zero or an integer from 1 to 3.

If the radicals $R^5$, $R^8$ and $R^{13}$ are or contain alkyl radicals, the latter generally have from 1 to 25, in particular from 1 to 18, carbon atoms.

Suitable thiazine dyes are compounds of the formula III, and suitable pyronine dyes are compounds of the formula IV

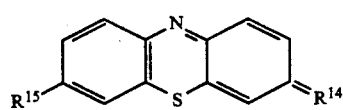
(III)

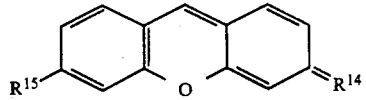
(IV)

in which
$R^{14}$ is one of the groups =NH$_2^{(+)}$ X$^{(-)}$ and =N(alkyl)$_2^{(+)}$ X$^{(-)}$,
$R^{15}$ is an amino, alkylamino or dialkylamino group and X is an anion.

In the formulas III and IV, alkyl groups have the same meanings as in the formula II.

A suitable porphyrine dye is, for example, hematoporphyrin, and a suitable acridine dye is, for example, acriflavinium chloride hydrochloride. Examples of compounds of the formula II are Eosine B (C.I. No. 45 400), Eosine J (C.I. No. 45 380), alcohol-soluble Eosine (C.I. 45 386), Cyanosine (C.I. No. 45 410), Rose Bengal (C.I. No. 45 440), Erythrosine (C.I. No. 45 430), 2,3,7 -trihydroxy-9-phenylxanthen-6-one and Rhodamine 6 G (C.I. No. 45 160).

Examples of compounds of the formula III are Thionine (C.I. No. 52 000), Azure A (C.I. No. 52 005) and Azure C (C.I. No. 52 002).

Examples of dyes of the formula IV are Pyronine B (C.I. No. 45 010) and Pyronine GY (C.I. No. 45 005). The amount of photoinitiator in the mixture is generally between about 0.01 and 10% by weight, relative to the nonvolatile components of the mixture.

In order to further increase the photosensitivity, the mixtures according to the invention may contain compounds which are known as free-radical-forming photoinitiators for photopolymerizable mixtures. As such coinitiators, compounds possessing trihalomethyl groups which can be split photolytically have proven particularly successful. From among the halogens, chlorine and bromine, in particular chlorine, are especially suitable.

The trihalomethyl groups can be bound directly to an aromatic carbocyclic or heterocyclic ring or via a conjugated chain. Preferred compounds are those containing triazine rings in the basic structures, which preferably carry 2 trihalomethyl groups, in particular those which are described in European Patent Application No. 137,452, German Offenlegungsschrift No. 2,718,259 and German Offenlegungsschrift No. 2,243,621. Coinitiators are also suitable which absorb only little, or not at all in the spectral region of the copying light such as trihalomethyltriazines which contain substituents having relatively short mesomerism-capable electron systems or aliphatic substituents. Compounds having another basic structure which absorb in the shorter-wave UV region, for example phenyl trihalomethyl sulfones or phenyl trihalomethyl ketones, for example phenyl tribromomethyl sulfone, are also suitable.

The coinitiators are generally employed in an amount from about 0.01 to 10, preferably from about 0.05 to 4% by weight, relative to the nonvolatile components of the mixture.

Binders which can be employed include a large number of soluble organic polymers. Examples which may be mentioned are: polyamides, polyvinyl esters, polyvinyl acetals, polyvinyl ethers, epoxy resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the homopolymers listed.

Further suitable binders are natural substances or converted natural substances, for example gelatine and cellulose ethers.

Binders which are insoluble in water but soluble, or at least swellable, in aqueous-alkaline solutions are used with particular advantage since layers containing such binders can be developed using the preferred aqueous-alkaline developers. Such binders can contain, for example, the following groups: —COOH, —$PO_3H_2$, —$SO_3H$; —$SO_2NH$—, —$SO_2$—NH—$SO_2$— and —$SO_2$—NH—CO—.

Examples of these which may be mentioned are: maleic resins, polymers made from β-(methacryloyloxy)-ethyl N-(p-tolylsulfonyl)-carbamate, and copolymers of these and similar monomers with other monomers, and also vinyl acetate/crotonic acid and styrene/maleic anhydride copolymers. Alkyl methacrylate/methacrylic acid copolymers and copolymers made from methacrylic acid, higher alkyl methacrylates and methyl methacrylate and/or styrene, acrylonitrile and the like, as described in German Offenlegungsschriften No. 2,064,080 and No. 2,363,806, are preferred.

The amount of binder is generally about 20 to 90, preferably about 30 to 80% by weight, of the components of the layer.

Depending on the planned use and on the desired properties, the photopolymerizable mixtures can contain a wide variety of substances as additives. Examples are: inhibitors for preventing thermal polymerization of the monomers, hydrogen donors, substances modifying the spectral sensitivity properties of the mixtures, particular 4,4'-disubstituted dibenzalacetones, such as 4-diethylamino-4'-methoxy-dibenzalacetone, and coumarine derivatives, such as 3-acetyl-7-diethylamino-coumarine, 3-benzimidazolyl-7-diethylamino-coumarine or carbonyl-bis-(7-diethylamino-coumarine), dyes, colored and colorless pigments, color-formers, indicators and plasticizers.

These components are expediently selected so that they absorb as little as possible in the actinic radiation region which is important for the initiation process.

In the context of this description, actinic radiation should be understood as any radiation whose energy corresponds at least to that of short-wave visible light. Visible light and long-wave UV radiation, but also short-wave UV radiation, laser radiation, electron radiation and X-ray radiation are suitable.

The photopolymerizable mixture can be used for a very wide variety of applications, for example for the production of paints which are hardened by light, as dental fillings or tooth replacement material and, in particular, as photosensitive recording material in the reproduction field.

The detailed description of the invention is limited to this latter area of application, but the invention is not limited thereto. Possible applications in this area which may be mentioned are: recording layers for photomechanical production of printing forms for letterpress printing, planographic printing, rotogravure printing, screen printing, of relief copies, for example the production of braille texts, of individual copies, tanned images, pigmented images etc. In addition, the mixtures can be used for photomechanical production of etch resists, for example for the production of nameplates, of copied circuits and for chemical milling. The mixtures according to the invention have particular importance as copying layers for the photomechanical production of planographic printing plates and for the photoresist technique.

The commercial utilization of the mixture for the applications mentioned can take place in the form of a liquid solution or dispersion, for example as a photoresist solution which is applied by the consumer himself to an individual support, for example for chemical milling, for the production of copied circuits, of screen-printing stencils and the like. The mixture can also be present as a solid, photosensitive layer on a suitable support in the form of a storable, pre-coated, photo-sensitive copying material, for examples for the production of printing plates. It is likewise suitable for the production of dry resist materials.

It is generally favorable to keep the mixture away from the influence of atmospheric oxygen during the photopolymerization. When the mixture is used in the form of thin copying layers, it is advisable to apply a suitable protective film which is virtually impermeable to oxygen. This can be self-supporting and removed before development of the copying layer. For this purpose, polyester films, for example, are suitable. The protective film can also comprise a material which dissolves in the developer liquid or can at least be removed during development from the non-hardened areas. Materials which are suitable for this purpose are, for example, waxes, polyvinyl alcohol, polyphosphates, sugars, etc. These protective films in general have a thickness between about 0.1 and 10 μm, in particular between about 1 and 5 μm.

Suitable layer supports for copying materials produced using the mixtures according to the invention are, for example, aluminum, steel, zinc, copper and plastic films, for example made from polyethylene terephthalate or cellulose acetate, and also screen-printing supports, such as Perlon gauze. In many cases, it is favorable to subject the support surface to pre-treatment (chemical or mechanical), the aim of which is to set the adhesion of the layer correctly, to improve the lithographic properties of the support surface or to reduce the reflectivity of the support in the actinic range of the copying layer (anti-halation).

The production of the light-sensitive materials using the mixture according to the invention takes place in a known fashion. Thus, this mixture can be taken up in a solvent, and the solution or dispersion can be applied to the intended support by pouring, spraying, dipping, roll application, etc. and subsequently dried. Thick layers (e.g. of 250 μm and more) are advantageously produced by extrusion or press molding as a self-supporting film, the latter then being laminated, if desired, onto the support. In the case of dry resists, solutions of the mixture are applied to transparent supports and dried. The photosensitive layers - thickness between about 10 and 100 μm - are then likewise laminated onto the desired substrate together with the temporary support.

The further processing of the materials is carried out in a known fashion. For better crosslinking of the layers, post-heating after exposure can take place.

For development, they are treated with a suitable developer solution, for example with organic solvents, but preferably with a slightly alkaline aqueous solution, the unexposed parts of the layer being removed and the exposed areas of the copying layer remaining on the support.

Illustrative embodiments of the invention are given below, with, firstly, a number of new polymerizable compounds being listed in Table I. These compounds are produced by one of the two processes given below. The compounds are employed as polymerizable compounds in the examples below in recording materials according to the invention. In the examples, parts by weight (pbw) and parts by volume (pbv) are in the ratio g to ccm. Percentage and weight ratios are taken to mean weight units, unless otherwise stated.

1. General procedure for the preparation of compounds of general formula I where $b=0$ (compounds 1, 4 and 5 in Table I)

The hydroxyalkyl-group-containing amino compound and the isocyanatoalkyl (meth)acrylate are refluxed in the desired molar ratio in ten times the amount of the suitable solvent (toluene, butanone or pyridine) with 0.01% by weight of dibutyltin dilaurate and 0.01% by weight of benzoquinone until the isocyanate band (2275-2250 cm$^{-1}$) can no longer be detected in the IR spectrum (generally after 5 to 8 hours). The solvent is subsequently removed by distillation in vacuo at 50° C. The unsaturated compound remains in virtually quantitative yield as a viscous residue.

2. General procedure for the preparation of compounds of the general formula I where $b=1$ (compounds 2 and 3 in Table I).

Hydroxyalkyl (meth)acrylate and diisocyanate are refluxed for 8 hours in the molar ratio 1:1 in ten times the amount of solvent (toluene, butanone or pyridine) with 0.01% by weight of benzoquinone, and the desired number of moles of hydroalkylamine is subsequently added and the mixture refluxed further until the isocyanate band has disappeared in the IR spectrum (generally after 5 to 8 hours). The solvent is subsequently removed by distillation in vacuo at 50° C. The unsaturated compound remains in virtually quantitative yield as a viscous residue.

ing plates. The support was coated with a solution of the following composition:

2.84 pbw of a 22.3% strength solution of a terpolymer made from styrene, n-hexyl methacrylate and methacrylic acid (10:60:30) and having an acid number of 190, in methyl ethyl ketone, 1.49 pbw of compound 1, and 0.04 pbw of alcohol-soluble Eosine (C.I. 45 386), in 22 pbw of propylene glycol monomethyl ether.

Application took place by spin-coating in a fashion such that a dry weight of 2.8 to 3 g/m$^2$ was obtained. The plate was subsequently dried for 2 minutes at 100° C. in a circulating air drying cabinet. The plate was then coated with a 15% strength aqueous solution of polyvinyl alcohol (12% of residual acetyl groups, K value 4). After drying, a protective layer having a weight of 4 to 5 g/m$^2$ was obtained. The printing plate obtained was exposed using a 5 kW metal halide lamp at a distance of 110 cm under a 13 step exposure wedge which contained density increments of 0.15. In order to test the sensitivity of the printing plate in visible light, a 3 mm thick sharp cut-off filter (from Schott) having the cut-off transmissions given in Table II was mounted in each case on the exposure wedge. After exposure, the plate was heated to 100° C. for one minute. It was subsequently developed in a developer of the following composition:

120 pbw of sodium metasilicate .9H$_2$O, 2.13 pbw of strontium chloride, 1.2 pbw of non-ionogenic wetting agent (coconut fatty alcohol polyoxyethylene ether containing about 8 oxyethylene units) and 0.12 pbw of antifoam agent, in 4000 pbw of demineralized water.

The plate was inked with an oily printing ink. The

TABLE I

| | Compounds of the general formula I with $R^2 = H$; $R^3 = CH_3$; $X^2 = C_2H_4$ | | | | | | | | | |
|---|---|---|---|---|---|---|---|---|---|---|
| Comp. No. | Q | R | $R^1$ | a | $X^1$ | b | m | n | N cal. | N found |
| 1 | —N—<br>\| | — | H | 1 | — | 0 | 3 | 3 | 9.1 | 8.8 |
| 2 | —N—<br>\| | — | H | 1 | *) | 1 | 3 | 3 | 8.4 | 8.7 |
| 3 | —N—CH$_2$—CH$_2$—N—<br>\|            \| | — | H | 1 | C$_6$H$_{12}$ | 1 | 4 | 4 | 8.0 | 8.2 |
| 4 | —N—CH$_2$—CH$_2$—N—<br>\|            \| | — | CH$_3$ | 1 | — | 0 | 4 | 4 | 9.1 | 8.8 |
| 5 | —N—<br>\| | C$_2$H$_4$OH | ( H  0  —  0 )<br>( —           0 ) | | | | 3 | 2 | 10.1 | 9.5 |

*) 2,2,4-Trimethyl-hexamethylene

EXAMPLE 1

Electrochemically roughened and anodized aluminum which had an oxide layer of 3 g/m$^2$ and which had been pretreated with an aqueous solution of polyvinylphosphonic acid was used as the layer support for printfollowing numbers of fully crosslinked wedge steps were obtained:

TABLE II

| Exposure (seconds) | Sharp cut-off filter | Wedge Steps |
|---|---|---|
| 40 | — | 3 |
| 40 | 400 | 2 |
| 50 | 455 | 1 |

A printing test with a plate exposed at wavelengths above 450 nm was stopped after 150,000 prints, although the screen (60 lines/cm) did not show any damage.

EXAMPLE 2

A solution of the following composition was spin-coated onto the layer support specified in Example 1, under the same conditions as in Example 1:
2.84 pbw of the terpolymer solution given in Example 1,
1.4 pbw of compound 1, and
0.02 pbw of dye, in
22.0 pbw of propylene glycol monomethyl ether.

After application of a protective layer of polyvinyl alcohol, the plates were exposed for 100 seconds and developed in the same way as in Example 1. The following number of fully crosslinked wedge steps was obtained:

TABLE III

| Dye (C.I. No.) | Sharp cut-off filter | Wedge Steps |
|---|---|---|
| Cyanosine | — | 7 |
| (45 410) | 400 | 4 |
|  | 455 | 3 |
| Thionine | — | 3 |
| (52 000) | 400 | 1 |
|  | 455 | 1 |
| Hematoporphyrine | — | 6 |
|  | 400 | 1 |
|  | 455 | — |

When, for example, trimethylolpropane triacrylate was used as the ethylenically unsaturated compound instead of compound 1, no sufficient crosslinking density could be achieved.

EXAMPLE 3

Solutions of the following composition were spin-coated onto the layer support material specified in Example 1, under the same conditions as in Example 1:
2.8 pbw of the terpolymer solution given in Example 1,
1.4 pbw of a monomer,
0.02 pbw of alcohol-soluble Eosine, and
0.08 pbw of 2,4-bis-trichloromethyl-6-(4-styrylphenyl)-s-triazine, in
22.0 pbw of propylene glycol monomethyl ether.

The coated plates were then dried for 2 minutes in a circulating air drying cabinet and coated with a protective layer as described in Example 1. They were exposed for 10 seconds through a 13-step exposure wedge on which, where specified, a silver film of uniform density (density 1.57) and uniform absorption over the effective spectral range had additionally been mounted, and then developed as in Example 1. The following numbers of wedge steps were obtained:

TABLE IV

| Comp. No. | Grey filter | Sharp cut-off filter | Wedge Steps |
|---|---|---|---|
| 2 | yes | — | 2 |
|  | no | 455 | 2 |
| 3 | yes | — | 3 |
|  | no | 455 | 3 |
| 5 | yes | — | 4 |
|  | no | 455 | 5 |

EXAMPLE 4

Solutions of the following compositions were spin-coated onto the support material specified in Example 1 so that coating weights of 3 g/m$^2$ were obtained:
2.9 pbw of terpolymer solution given in Example 1,
1.4 pbw of compound 1,
0.02 pbw of dye and
0.08 pbw of 2,4-bis-trichloromethyl-6-(4-styrylphenyl)-s-triazine, in
22.0 pbw of propylene glycol monomethyl ether.

The plates were processed in the same way as in Example 3. The following numbers of fully crosslinked wedge steps were obtained in each case:

TABLE V

| Dye | Exposure time(s) | Grey filter | Sharp cut-off filter | Wedge steps |
|---|---|---|---|---|
| Hematoporphyrine | 40 | yes | — | 8 |
|  | 5 | no | 455 | 3 |
| 2,3,7-Trihydroxy-9-phenyl-xanthen-6-one | 40 | yes | — | 9 |
|  | 40 | no | 455 | 2 |
| Thionine | 40 | yes | — | 4 |
|  | 40 | no | 455 | 2 |
| Cyanosine | 5 | yes | — | 4 |
|  | 5 | no | 455 | 3 |
| 2,7-Dichloro-fluorescine | 40 | yes | — | 6 |
|  | 40 | — | 455 | 3 |
| Acritiavinium/chloride-hydrochloride | 10 | yes | — | 5 |
|  | 10 | — | 455 | 2 |

The printing plate where Thionine was employed as longwave sensitizer was exposed by means of a He/Ne-laser equipment (632.8 nm). A satisfactory crosslinking density was achieved.

EXAMPLE 5

A solution of the following composition was spin-coated onto the support material specified in Example 1 so that, after drying, a coating weight of 3 g/m$^2$ was obtained:
2.8 pbw of a 33.4% strength solution of a methyl methacrylate/methacrylic acid copolymer having an acid number of 110 and an average molecular weight of 35,000, in butanone,
1.4 pbw of compound 1,
0.02 pbw of alcohol-soluble Eosine and
0.05 pbw of a halogen compound of Table VI, in
22.0 pbw of propylene glycol monomethyl ether.

The plates were processed as in Example 3, after which the number of fully crosslinked wedge steps given in Table VI was obtained:

TABLE VI

| Halogen compound | Grey filter | Sharp cut-off filter | Wedge Steps |
| --- | --- | --- | --- |
| 2,4-Bis-trichloro-methyl-6-(5-methoxy-naphth-l-yl)-s-triazine | yes<br>no | —<br>455 | 3<br>2 |
| Phenyl-tribromo-methyl-sulfone | no<br>no | —<br>455 | 5<br>2 |

EXAMPLE 6

The printing plate of Example 4, employing Cyanosine as the long-wave sensitizer, was exposed by means of an expanded argon ion laser beam which at a wavelength of 514 nm had an energy of 0.2 mW/cm². After an exposure time of 25 seconds the layer was completely crosslinked.

EXAMPLE 7

Solutions of the following compositions were spin-coated onto the support material specified in Example 1 so that a dry layer weight of 3 g/m² was obtained:
2.84 pbw of the terpolymer solution specified in Example 1,
0.7 pbw of a compound of Table VII,
0.7 pbw of trimethylolpropane-triacrylate,
0.08 pbw of 2,4-bis-trichloromethyl-6-(4-styrylphenyl)-s-triazine, in
22.0 pbw of propylene glycol monomethyl ether.

The plates were processed in accordance with Example 1. The following numbers of completely crosslinked wedge steps were obtained after an exposure time of 40 seconds:

TABLE VII

| Compound No. | Grey filter | Sharp cut-off filter | Wedge steps |
| --- | --- | --- | --- |
| 1 | yes<br>no | —<br>455 | 5<br>5 |
| 4 | yes<br>no | —<br>455 | 8<br>7 |

EXAMPLE 8

Solutions of the following compositions were spin-coated onto the support material specified in Example 1 so that a dry layer weight of 3 g/m² was obtained:
2.84 pbw of the terpolymer solution specified in Example 1
1.4 pbw of compound 1,
0.1 pbw of a carbonyl compound according to Table VIII,
0.02 pbw of alcohol-soluble Eosine, and
0.08 pbw of 2,4- bis - trichloromethyl - 6 - (4 -styrylphenyl)- s-triazine, in
22.0 pbw of propylene glycol monomethyl ether.

The plates were processed as described in Example 1. The following numbers of completely crosslinked wedge steps were obtained after an exposure time of 40 seconds.

TABLE VIII

| Carbonyl compound | Grey filter | Sharp cut-off filter | Wedge Steps |
| --- | --- | --- | --- |
| 4-Dimethylamino-4'-methoxy-dibenzal-acetone | — <br> 455 | 3<br>4 |  |
| 3-Acetyl-7-diethyl-amino-coumarine | —<br>455 | 8<br>10 |  |

The effectiveness of the added compounds was determined with respect to the resolving power, using the FOGRA-PMS wedge, and read off on the copy. The above-mentioned mixture without dibenzal acetone or coumarine derivative gave in each case a resolution which was worse by at least one step in the K field of the test pattern.

EXAMPLE 9

The coating solution from Example 4 with Cyanosine as long-wave sensitizer was spin-coated onto a biaxially stretched 35 μm thick polyethylene terephthalate film so that, after drying, a layer weight of 5 g/m² was obtained. The layer was post-dried for 3 minutes at 100° C. in a circulating air drying cabinet. The layer was subsequently laminated at 115° C. at a rate of 1.5 m/s onto a cleaned base comprising an insulating material with a 35 μm copper coating.

The coating was exposed for 30 seconds using a 5 kW metal halide lamp (distance 140 cm) under a sharp cut-off filter 455, as described in Example 1, and under a step wedge, and developed for 20 seconds in a spray processor using 0.8% strength soda solution after removing the film. 4 fully crosslinked wedge steps were obtained. The crosslinked layer was resistant to the iron(III) chloride solution which is customary in printed circuit board technology. The etch resistance was good.

What is claimed is:
1. A photopolymerizable mixture consisting essentially of:
a) a polymeric binder present in an amount sufficient to form a uniform layer,
b) an acrylate or alkacrylate of a polyhydric alcohol represented by the formula

$$R_{(m-n)}Q[(-CH_2-\underset{R^2}{\overset{R^1}{\underset{|}{\overset{|}{C}}}}-CO)_a-CONH(X^1-NHCOO)_b- \\ -X^2(-OOC-\underset{}{\overset{R^3}{\underset{|}{\overset{|}{C}}}}=CH_2)_c]_n \quad (I)$$

in which
Q denotes $$-\overset{|}{N}-, \; -\overset{|}{N}-E-\overset{|}{N}-, \; \text{or} \; -N\overset{D^1}{\underset{D^2}{\diagup\!\!\!\diagdown}}N-,$$

R denotes an alkyl, hydroxyalkyl or aryl group,
R¹ and R² each denote a hydrogen atom, an alkyl group or an alkoxyalkyl group,
R³ denotes a hydrogen atom, a methyl group or an ethyl group,
X¹ denotes a saturated hydrocarbon group having 2 to 12 carbon atoms, X² denotes a (c+1)-valent saturated hydrocarbon group in which up to 5 methylene groups may be replaced by oxygen atoms, D¹ and D² each denote a saturated hydrocarbon group having 1 to 5 carbon atoms, E denotes a saturated hydrocarbon group having 2 to 12 carbon atoms, a cycloaliphatic group which has 5 to 7 ring members and which contains, where appropriate, up to 2 N, O or S atoms as ring members, an arylene group having 6 to 12 carbon atoms, or a heterocyclic aromatic group having 5 or 6 ring members, a denotes 0 or an integer from 1 to 4, b denotes 0 to 1, a+b is at least 1, c denotes an integer from 1 to 3, m denotes 2, 3 or 4, depending on the valency of Q, and n denotes an integer from 1 to m, it being possible for all radicals of the same definition to be identical to or different from one another, and c) a photoreducible dye as photoinitiator, wherein components b) and c) are present in an amount sufficient to render exposed areas insoluble in developer and wherein the acrylate or alkacrylate contains one or more groups which are photooxidizable upon exposure in the presence of the photoreducible dye, and one or more urethane groups.

2. A mixture as claimed in claim 1, wherein n=m.

3. A mixture as claimed in claim 1, wherein E is a saturated alkylene group having 2 to 4 carbon atoms.

4. A mixture as claimed in claim 1, wherein R³=CH₃.

5. A mixture as claimed in claim 1, wherein a+b=1 or 2.

6. A mixture as claimed in claim 5, wherein the xanthene dye is a compound of the formula II

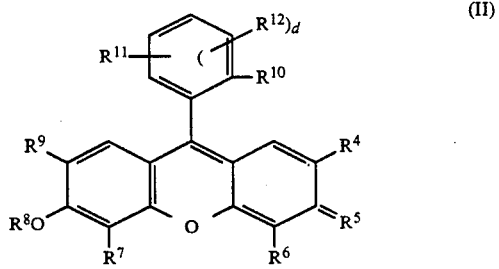

in which

R⁴ and R⁹ are identical or different and denote hydrogen or halogen atoms, nitro or hydroxyl groups or groups of the formula —HgOH, R⁶ and R⁷ are identical or different and denote hydrogen or halogen atoms or hydroxyl groups, R⁵ denotes O or (+)NHalkyl X(—), R⁸ denotes a hydrogen atom, an alkali metal, ammonium or trialkylammonium cation, or an alkyl or acyl group, R¹⁰ denotes a hydrogen atom or a COOR¹³ group, R¹¹ denotes a hydrogen or halogen atom or an amino group, R¹² denotes a hydrogen or halogen atom, R¹³ denotes a hydrogen atom, an alkali metal or ammonium cation, an alkyl group or a polymeric radical, X denotes an anion, and d denotes zero or an integer from 1 to 3.

7. A mixture as claimed in claim 1, wherein the photoreducible dye is a xanthene, thiazine, pyronine, porphyrine or acridine dye.

8. A mixture as claimed in claim 7, wherein the dye is a compound of one of the formulae III and IV

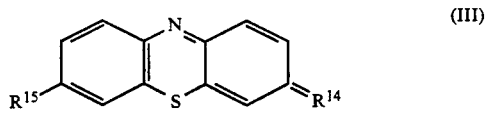

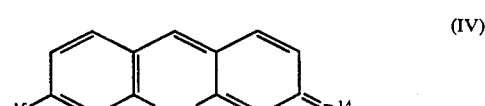

in which

R¹⁴ is one of the groups =NH₂(+) X(—) and =N(alkyl)₂(+) X(—),

R¹⁵ is an amino, alkylamino or dialkylamino group and

X is an anion.

9. A mixture as claimed in claim 1, wherein the binder is insoluble in water and soluble in aqueous-alkaline solutions.

10. A mixture as claimed in claim 1, which contains 10 to 80% by weight of acrylate or alkacrylate, 20 to 90% by weight of polymeric binder and 0.01 to 10% by weight, relative to the nonvolatile components of the mixture, of the photoreducible dye.

11. A photopolymerizable recording material comprising a layer support and a photopolymerizable layer, wherein the photopolymerizable layer comprises a mixture as claimed in claim 1.

12. A photopolymerizable recording material according to claim 1, wherein said acrylate or alkacrylate of polyhydric alcohol is present in an amount ranging from about 10 to 80% by weight of the mixture.

13. A photopolymerizable recording material according to claim 1, wherein the photoreducible dye is present in an amount ranging from about 0.1 to 10% by weight, relative to the non-volatile components of the mixture.

14. A mixture as claimed in claim 1, wherein a=0 in not more than one radical.

15. A mixture as claimed in claim 1, wherein a=1.

16. A mixture as claimed in claim 1, wherein a=1 to 4.

17. A photopolymerizable mixture consisting essentially of:
(a) a polymeric binder,
(b) an acrylate or alkacrylate of a polyhydric alcohol,
(c) a photoreducible dye as photoinitiator, and
(d) a compound with an exposure forms free radicals which are capable of initiating polymerization of the acrylate or alkacrylate wherein the acrylate or alkacrylate contains one or more groups which are photooxidizable upon exposure in the presence of the photoreducible dye, and one or more urethane groups.

18. A mixture as claimed in claim 17, wherein the free radical-forming compound is an s-triazine which is substituted by at least one trihalomethyl group and one further group or is an aryl trihalomethyl sulfone.

19. A mixture as claimed in claim 18, wherein the further group contains at least one aromatic ring which is connected to the triazine radical either directly or via a conjugated double bond system.

* * * * *